(12) United States Patent
Jang et al.

(10) Patent No.: US 10,033,562 B2
(45) Date of Patent: Jul. 24, 2018

(54) APPARATUS FOR ENVELOPE DELAY CONTROL IN AN ENVELOPE-TRACKING POWER AMPLIFIER

(71) Applicant: ELECTRONICS AND TELECOMMUNICATIONS RESEARCH INSTITUTE, Daejeon (KR)

(72) Inventors: Seung Hyun Jang, Daejeon (KR); Bong Hyuk Park, Daejeon (KR); Hui Dong Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/460,537

(22) Filed: Mar. 16, 2017

(65) Prior Publication Data

US 2017/0272290 A1    Sep. 21, 2017

(30) Foreign Application Priority Data

Mar. 17, 2016    (KR) .................. 10-2016-0032244

(51) Int. Cl.
| | | |
|---|---|---|
| *H04L 7/04* | (2006.01) | |
| *H04L 27/20* | (2006.01) | |
| *H04B 1/04* | (2006.01) | |
| *H04L 27/12* | (2006.01) | |

(52) U.S. Cl.
CPC ........... *H04L 27/2003* (2013.01); *H04B 1/04* (2013.01); *H04L 27/122* (2013.01); *H04B 2001/0408* (2013.01)

(58) Field of Classification Search
CPC ..... H04L 27/2003; H04L 27/122; H04B 1/04; H04B 2001/0408
USPC .................. 375/362, 224; 330/109
See application file for complete search history.

(56) References Cited

U.S. PATENT DOCUMENTS

| | | | |
|---|---|---|---|
| 8,908,797 B2 | 12/2014 | Jeckein | |
| 2011/0227642 A1* | 9/2011 | Hoyerby | H03F 1/32 330/109 |
| 2012/0154036 A1 | 6/2012 | Oh et al. | |
| 2013/0034139 A1* | 2/2013 | Khlat | H03F 1/0227 375/224 |
| 2014/0064355 A1 | 3/2014 | Cho et al. | |

FOREIGN PATENT DOCUMENTS

KR    10-2013-0102474 A    9/2013

* cited by examiner

*Primary Examiner* — Chieh M Fan
*Assistant Examiner* — Fitwi Hailegiorgis
(74) *Attorney, Agent, or Firm* — LRK Patent Law Firm

(57) ABSTRACT

An envelope signal time delay adjustment apparatus includes a negative group delay unit for converting an envelope signal input from a signal generator into an envelope signal having a group delay of a negative value whose frequency increases from a predetermined frequency band; an envelope-tracking modulator for power-amplifying and outputting the envelope signal output from the negative group delay unit; and a frequency limiting unit for limiting a bandwidth of the envelope-tracking modulator to be lower than an original bandwidth of the envelope-tracking modulator.

4 Claims, 8 Drawing Sheets

APPARATUS FOR ENVELOPE DELAY CONTROL IN AN ENVELOPE-TRACKING POWER AMPLIFIER

CROSS-REFERENCE TO RELATED APPLICATION(S)

This application claims priority to Korean Patent Application No. 10-2016-0032244, filed on Mar. 17, 2016 in the Korean Intellectual Property Office (KIPO), the entire content of which is hereby incorporated by reference.

BACKGROUND

1. Technical Field

The present disclosure relates to an envelope-tracking power amplifier, and more particularly, to an apparatus for controlling time delay occurring in an envelope-tracking modulator.

2. Description of Related Art

Recent mobile communication systems are evolving into communication systems based on Orthogonal Frequency-Division Multiplexing (OFDM) with a large amplitude variation, which is different from the past communication systems such as Global System for Mobile Communications (GSM). For example, Worldwide Interoperability for Microwave Access (WiMAX) and Wireless Broadband Internet (WiBro), as well as the long-term evolution (LTE) which is currently in the spotlight, use OFDM-based communication methods.

However, the OFDM-based transmitter has a disadvantage in that its power amplifier may not operate efficiently due to high peak to average power ratio (PAPR) characteristics. In order to overcome the above drawback, various transceiving techniques have been proposed, one of which is an envelope-tracking (ET) power amplifier.

In the ET power amplifier, a signal having a waveform similar to the envelope of the power amplifier input signal is applied to a power supply unit of the power amplifier so that the power amplifier always operates in the saturation region, thereby achieving high-efficiency performance.

However, in case that the envelope signal applied to the power supply unit of the ET power amplifier and the communication signal output after power amplification in the power amplifier are not well time-synchronized, nonlinearity in the output of the power amplifier may be greatly increased, and Adjacent Channel Leakage Ratio (ACLR) may also be increased so that it may be difficult to transmit signals wirelessly.

One of the biggest obstacles to synchronization between the power amplifier output signal and the envelope signal output from an ET modulator is that the ET modulator has a large time delay due to the relatively narrow bandwidth. Therefore, minimizing the time delay of the ET modulator is an effective way to synchronize the output signal of the ET power amplifier and the envelope signal output from the ET modulator.

SUMMARY

Accordingly, exemplary embodiments of the present disclosure are provided to substantially obviate one or more problems due to limitations and disadvantages of the related art.

Exemplary embodiments of the present disclosure provide a delay time adjustment apparatus for an envelope signal of an envelope-tracking power amplifier, which can minimize a time delay of an envelope-tracking modulator.

Exemplary embodiments of the present disclosure also provide a delay time adjustment apparatus for an envelope signal of an envelope-tracking power amplifier, which can overcome a slow response speed due to uncertainty of detecting a group delay difference and a narrow negative feedback loop bandwidth.

Technical objects of the present disclosure are not limited to the aforementioned technical objects and other technical objects which are not mentioned will be apparently appreciated by those skilled in the art from the following description.

In order to achieve the above-described objective, an aspect of the present disclosure provides an envelope signal time delay adjustment apparatus comprising a negative group delay unit for converting an envelope signal input from a signal generator into an envelope signal having a group delay of a negative value whose frequency increases from a predetermined frequency band; an envelope-tracking modulator for power-amplifying and outputting the envelope signal output from the negative group delay unit; and a frequency limiting unit for limiting a bandwidth of the envelope-tracking modulator to be lower than an original bandwidth of the envelope-tracking modulator.

According to the configuration of the present disclosure, a group delay difference detector is not present in the time delay adjustment apparatus for the envelope-tracking modulator. Therefore, since the uncertainty that may occur in the group delay difference detector is removed for a signal waveform whose size continuously changes as in an OFDM signal and whose size is reduced to 0 (zero) at a specific temporal point, more stable operations can be made possible.

Also, in the time delay adjustment apparatus for the envelope-tracking modulator according to the present disclosure, there is no negative feedback loop that is fed back from the output of the envelope-tracking modulator to the input of the negative group delay unit. Therefore, the time delay adjustment apparatus according to an embodiment of the present disclosure has an advantage that it can exhibit faster response performance than the apparatus of the prior art.

In addition, if the frequency determining circuit and the frequency limiting circuit are composed of a passive resistor and a passive capacitor, the group delay difference detector and the control signal generator that are present in the prior art are not needed, so that there is an advantage that low power consumption can be realized.

BRIEF DESCRIPTION OF DRAWINGS

Exemplary embodiments of the present disclosure will become more apparent by describing in detail exemplary embodiments of the present disclosure with reference to the accompanying drawings, in which.

DESCRIPTION OF EXEMPLARY EMBODIMENTS

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Combinations of respective blocks in an accompanying block diagram and respective operations in a flowchart may be performed by computer program instructions. These computer program instructions can be mounted on a processor of a general purpose computer, a special purpose computer, or other programmable data processing equipment, and thus the instructions performed by the processor of the computer or other programmable data processing equipment generate a means for performing functions described in the respective blocks of the block diagram or the respective operations of the flowchart. To implement functions in a specific way, these computer program instructions can be stored in a computer-usable or computer-readable memory capable of aiming for a computer or other programmable data processing equipment, so that the instructions stored in the computer-usable or computer-readable memory can also produce a manufactured item including an instruction means for performing functions described in the respective blocks of the block diagram or the respective operations of the flowchart.

In addition, each block or operation may indicate a part of a module, a segment or a code including one or more executable instructions for executing specific logical function(s). It should be noted that mentioned functions described in blocks or operations can be executed out of order in some alternative embodiments. For example, two consecutively shown blocks or operations can be performed substantially at the same time, or can be performed in a reverse order according to the corresponding functions.

Hereinafter, exemplary embodiments according to the present disclosure will be described in detail by referring to accompanying drawings. However, the exemplary embodiments according to the present disclosure may be changed into various forms, and thus the scope of the present disclosure is not limited to the exemplary embodiments which will be described. The exemplary embodiments are provided to assist the one of ordinary skill in the art. in gaining a comprehensive understanding of the methods, apparatuses, and/or systems described herein.

Figure 1:
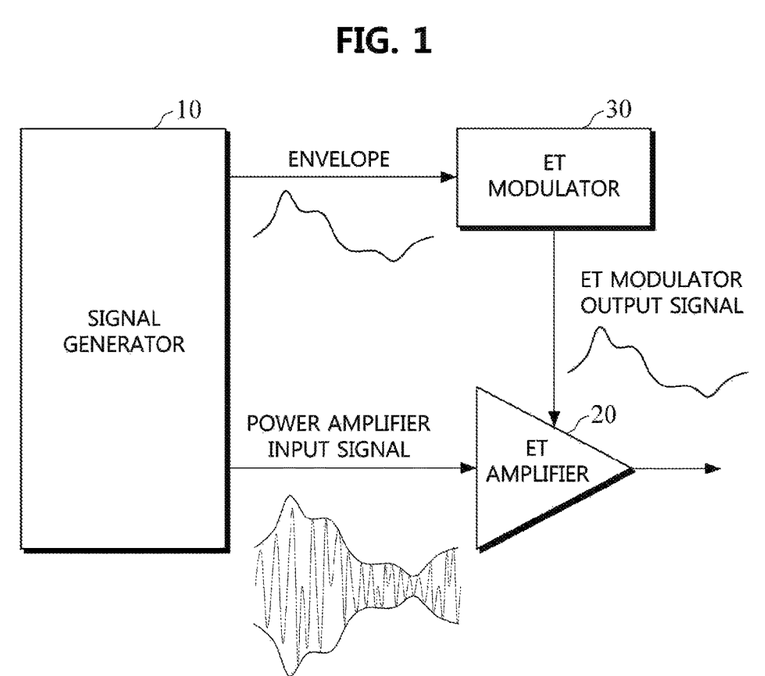
FIG. 1 is a block diagram illustrating a general envelope-tracking power amplifier.

FIG. 1 is a block diagram illustrating a general envelope-tracking power amplifier.

Referring to FIG. 1, when an envelope signal applied to a power supply unit of a power amplifier 20 and a communication signal output after power amplification by the power amplifier 20 is not time-synchronized, large non-linearity may occur in the output of the power amplifier 20, and lower the quality of the signals. Also, adjacent channel leakage ratio (ACLR) may have a poor performance, making it difficult to transmit signals wirelessly. This will be described with reference to FIG. 2.

Figure 2A:
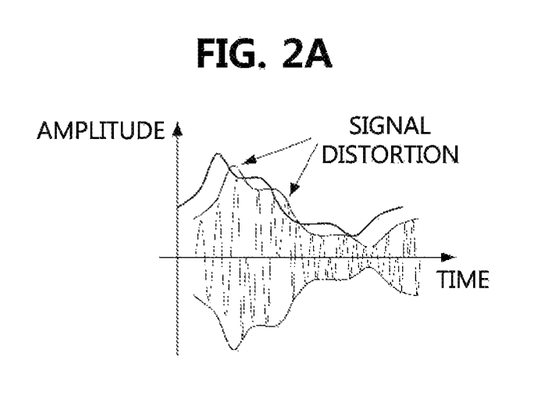
FIGS. 2A to 2C are diagrams illustrating an example of an envelope-tracking modulator output signal and a power amplifier output signal over time.
Figure 2B:
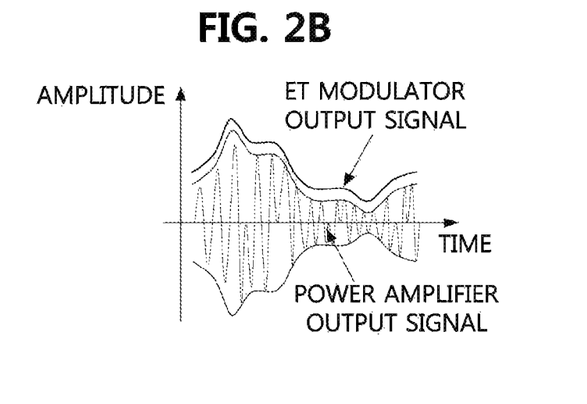
Figure 2C:
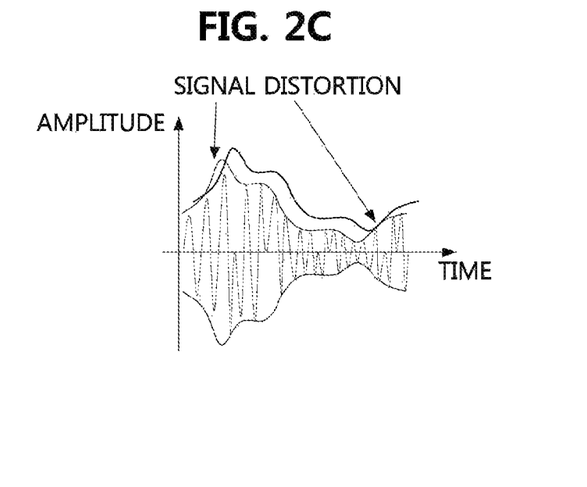

FIGS. 2A to 2C are diagrams illustrating an example of an envelope-tracking modulator output signal and a power amplifier output signal over time.

In FIG. 2A and FIG. 2C, cases in which the output signal of the envelope-tracking (ET) modulator 30 is not time-synchronized with the output signal of the ET power amplifier 20 are illustrated. In these cases, signal distortion may occur at the output of the ET power amplifier 20, which degrades the linearity of the output signal.

However, FIG. 2B illustrates a case in which the output signal of the ET modulator 30 is well time-synchronized with the output signal of the ET power amplifier 20. In this case, the distortion in the output of the ET power amplifier 20 is less likely to occur, and the signal linearity performance is much better than those shown in FIG. 2A and FIG. 2C.

Therefore, in the ET power amplifier, it is very important that the time synchronization between the output envelope signal of the ET modulator 30 and the output signal of the ET power amplifier 20 is adjusted to secure the linearity of the output signal of the ET power amplifier 20.

Meanwhile, one of the biggest obstacles for synchronizing the output signal of the ET power amplifier 20 and the output envelope signal of the ET modulator 30 is that the ET modulator 30 has a large time delay due to the relatively narrow bandwidth. On the contrary, since the input signal of the ET power amplifier passes through a circuit operating in a high-frequency band, its time delay is usually small. Accordingly, even if the signal generator 10 simultaneously generates the input signal for the ET power amplifier and the envelope signal for the ET modulator, the time delay in the ET power amplifier 20 is small and the time delay in the ET modulator is larger. Thus, a time difference between the output signal of the ET power amplifier 20 and the output envelope signal of the ET modulator 30 becomes large at the output of the ET power amplifier 20, so that the synchronization between the two signals becomes broken.

FIG. 2A illustrates the above situation, where the time delay from the input to the output of the normal power amplifier is a few hundreds of picoseconds (ps) and that of the ET modulator 30 is on the order of a few nanoseconds (ns). The amount of time delay occurring due to the narrow bandwidth of the ET modulator 30 will be described with reference to FIG. 3A and FIG. 3B.

Figure 3A:
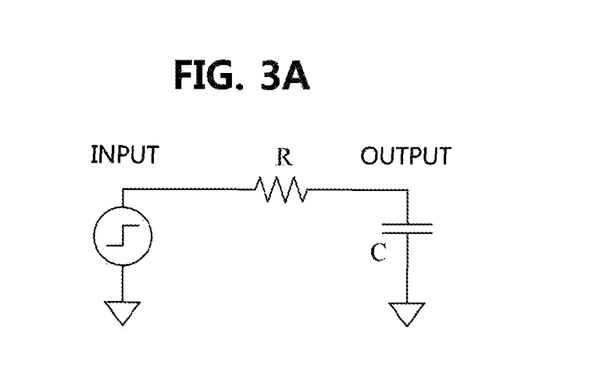
FIG. 3A and FIG. 3B are views illustrating an RC circuit and input/output waveform response characteristics of the RC circuit.
Figure 3B:
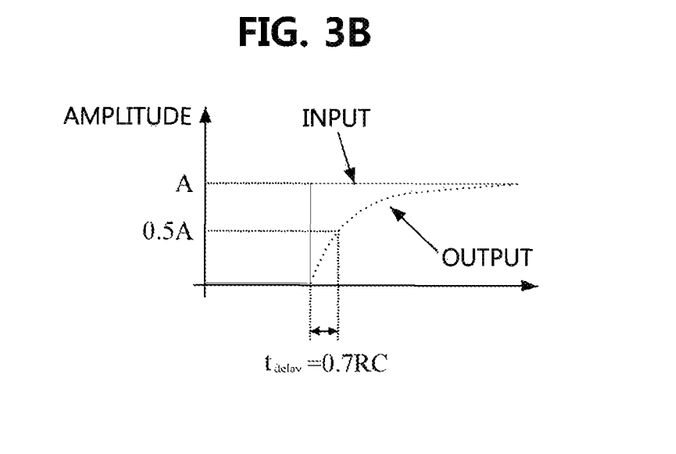

FIG. 3A and FIG. 3B are views illustrating an RC circuit and input/output waveform response characteristics of the RC circuit.

FIG. 3A illustrates a circuit composed of a resistor R and a capacitor C, and when an input signal shown as a solid line in FIG. 3B is applied to this circuit, an output signal shown as a dotted line is output with a time delay. Here, the time delay $t_{delay}$ may be expressed by a below equation 1.

$$t_{delay} \approx 0.7 \times RC \quad \text{[Equation 1]}$$

Also, the bandwidth of the RC circuit shown in FIG. 3A may be approximated by a below equation 2.

$$BW \approx \frac{1}{2\pi RC} \quad \text{[Equation 2]}$$

Therefore, the relationship between the time delay and the bandwidth of the circuit shown in FIG. 3A may be defined by a below equation 3 based on the equations 1 and 2.

$$t_{delay} \approx \frac{0.12}{BW} \quad \text{[Equation 3]}$$

Considering that the bandwidth of the ET modulator used in recent mobile communication systems is about 60 MHz, when the 60 MHz is substituted into the equation 3, the time delay occurring in the ET modulator 30 may be about 2 ns.

When considering that the time delay of the ET power amplifier is several hundreds of picoseconds, the above time delay is a very large value. Thus, minimizing the time delay of the ET modulator is an effective way to better align the time synchronization between the ET power amplifier output signal and the envelope signal out from the ET modulator.

An exemplary structure that minimizes the time delay of such the ET modulator is disclosed in Korean patent application No. 10-2015-0013278 titled as 'Apparatus and method for envelope signal delay adjustment of envelope-tracking power amplifier'.

Figure 4:
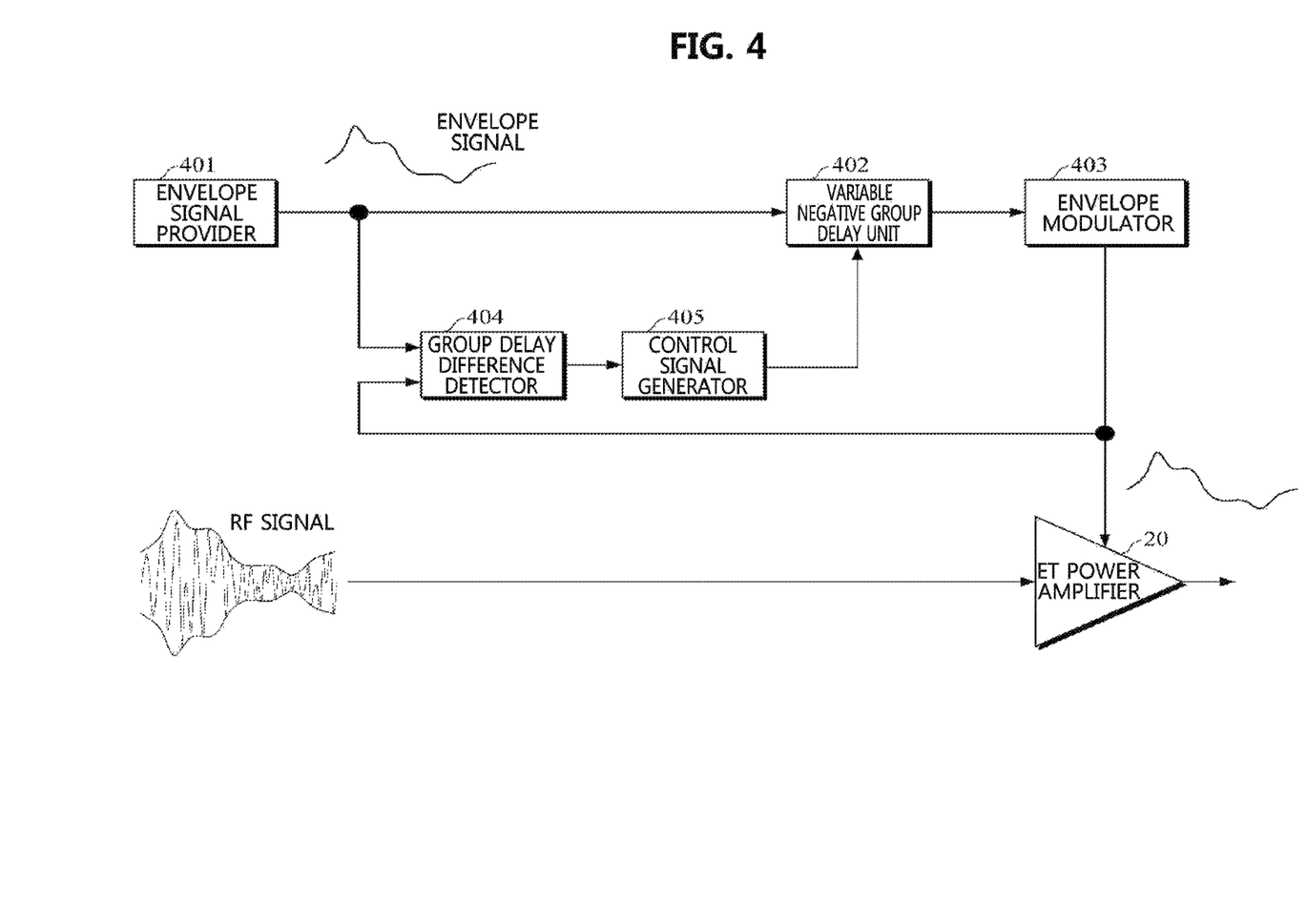
FIG. 4 is a structural diagram of an envelope signal delay adjustment apparatus of an envelope-tracking power amplifier.

FIG. 4 is a structural diagram of an envelope signal delay adjustment apparatus of an envelope-tracking power amplifier.

Referring to FIG. 4, a group delay of a variable negative group delay unit 402 having a negative time delay (i.e., its output signal has a characteristic of coming out earlier than the input signal) is adjusted to compensate a group delay having a positive value generated in an envelope modulator 403. Here, a group delay difference between the input envelope signal for the variable negative group delay unit 402 and output envelope signal of the envelope modulator 403 may be detected by a group delay difference detector 404, and a control signal for varying the group delay of the variable negative group delay unit 402 is generated by a control signal generator 405 in such a direction as to minimize the difference.

However, prior arts disclosed in the above-mentioned prior patent application have the following problems.

First, it is not easy to detect the group delay difference between the two envelope signals at the group delay difference detector 404 since the sizes of the envelope signals continuously change. In order to precisely detect the group delay difference between two signals, the sizes of the two signals should be sufficiently large. In the case of a mobile communication signal based on orthogonal frequency division multiplexing (OFDM), the size of the mobile communication signal is continuously changed, and thus there is a period in which the size becomes close to 0. In this period, since the signal size is too small, it is difficult to detect the accurate group delay difference because the uncertainty about the time delay difference to be detected based on a certain point is increased.

Second, the control signal of the variable negative group delay unit 402 is controlled by a negative feedback loop consisting of the variable negative group delay unit 402, the envelope modulator 403, the group delay difference detector 404, and the control signal generator 405, and it may be difficult to have a wide loop bandwidth in which stability is ensured due to the negative feedback composed of several blocks. Therefore, when the envelope signal generated by the envelope signal provider 401 is applied to the negative feedback, the time taken until the negative feedback is stabilized becomes long due to the narrow negative feedback loop bandwidth. Accordingly, in the case of Time Division Duplexing (TDD) of the mobile communication signal, there is a problem that the structure disclosed in the prior patent application is hard to respond quickly, although negative feedback should react quickly when a signal exists.

Accordingly, the present disclosure provides an apparatus and method for time synchronization between an input signal of an ET power amplifier and an envelope signal output from an ET modulator and applied to a power supply unit of the ET power amplifier. Particularly, the present disclosure provides an apparatus and method of a new structure capable of overcoming the uncertainty of group delay difference detection, which is a disadvantage of the prior art, and the slow response speed due to the narrow negative feedback loop bandwidth.

Figure 5:
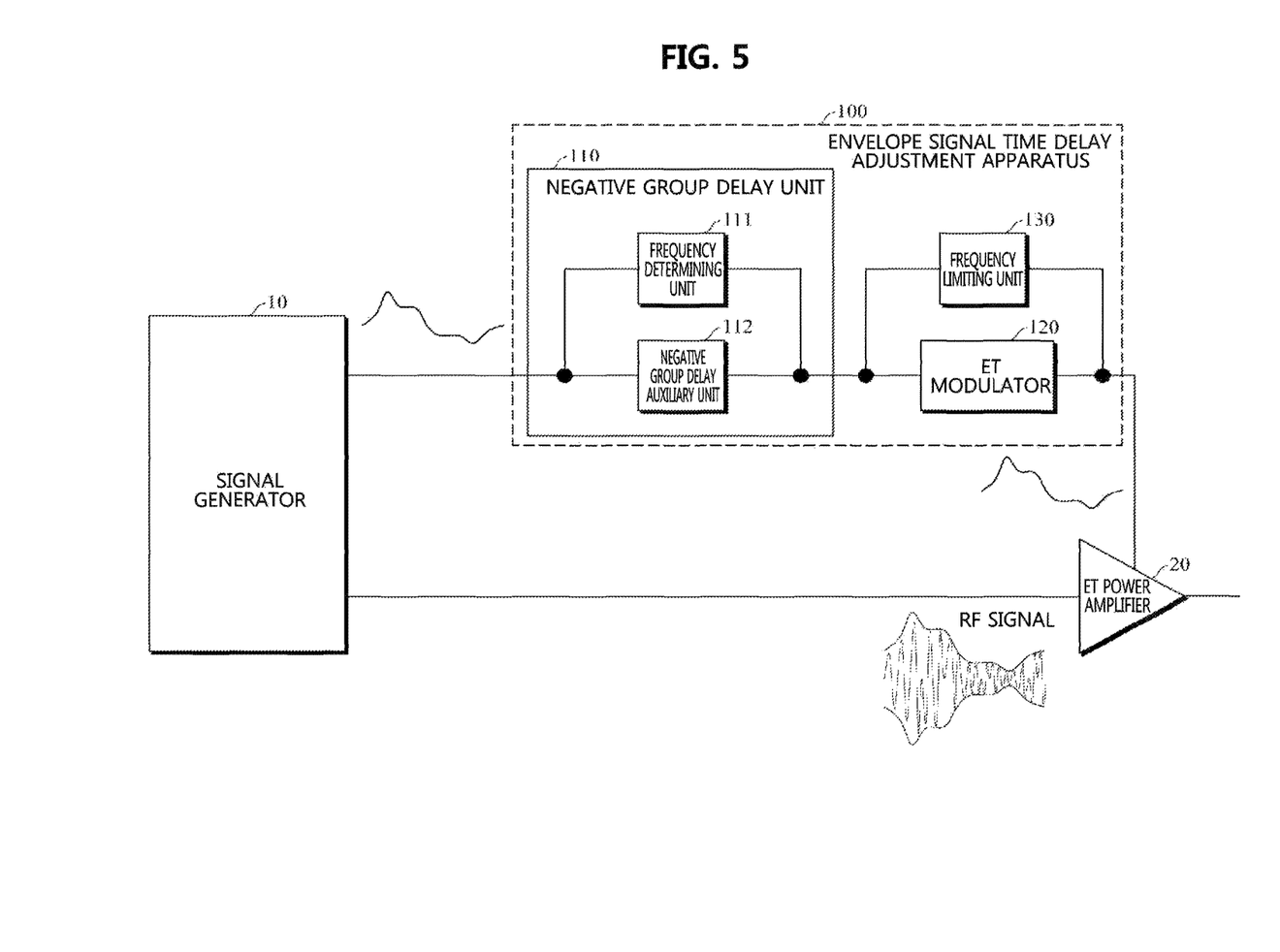
FIG. 5 is a structural diagram illustrating a time delay adjustment apparatus for an envelope-tracking modulator according to an exemplary embodiment of the present disclosure.

FIG. 5 is a structural diagram illustrating a time delay adjustment apparatus for an envelope-tracking modulator according to an exemplary embodiment of the present disclosure.

Referring to FIG. 5, an envelope signal time delay adjustment apparatus 100 may adjust a time delay of the envelope signal output from the signal generator 10 and output the adjusted envelope signal to a power supply unit of the ET power amplifier 20. Also, the apparatus 100 may comprise a negative group delay unit 110, an ET modulator 120, and a frequency limiting unit 130.

The negative group delay unit 110 may convert the envelope signal input from the signal generator 10 into an envelope signal having a group delay of a negative value whose frequency increases from a predetermined frequency band and output the envelope signal. Here, the negative group delay unit 110 may include a frequency determining unit 111 and a negative group delay auxiliary unit 112 in detail, and a detailed configuration and description thereof will be described later with reference to FIG. 7.

The ET modulator 120 may amplify and output the envelope signal output from the negative group delay unit 110. Also, the frequency limiting unit 130 may limit the bandwidth of the ET modulator 120 to be lower than the original bandwidth. A detailed configuration and description thereof will be described later with reference to FIG. 8.

Here, the frequency determining unit 111 and the frequency limiting unit 130 may be disposed physically close to each other so that the frequency determining unit 111 and the frequency limiting unit 130 may be influenced in the same manner according to changes in the surrounding environment. The group delay having a negative value of the negative group delay unit 110 specified by the frequency determining unit 111 is determined by a system designer such that it is sufficient to compensate the group delay having a positive value of the ET modulator 120.

The operation of the time delay adjustment apparatus according to an exemplary embodiment of the present disclosure will be described as follows.

The signal generator 10 may generate and output a Radio Frequency (RF) signal to the ET power amplifier 20 and an envelope signal to be input to the ET modulator 120. Here, the RF signal is amplified by the ET power amplifier 20 and output through an output terminal of the power amplifier 20. Here, since the group delay of the ET power amplifier 20 is typically smaller than the time delay experienced by the envelope signal passing through the ET modulator, the time delay experienced by the RF signal is small.

The envelope signal output from the signal generator 10 is input to the negative group delay unit 110 having a negative group delay and then output to the ET modulator 120. Here, the group delay of the negative group delay unit 110 is determined by the frequency determining unit 111. That is, in order to exhibit the negative group delay characteristic, the gain should increase as the frequency of the negative group delay unit 110 increases from a specific frequency band which is determined by the frequency determining unit 111.

The frequency characteristics of the negative group delay unit 110, formed by combining the frequency determining unit 111 and the negative group delay auxiliary unit 112, may be specified by the frequency determining unit 111, and the specified frequency characteristics may specific the negative group delay. The envelope signal input from the signal generator 10 is output to the ET modulator 120 with a negative time delay given by the negative group delay unit 110 having the specified negative group delay characteristics.

Although the group delay of the ET modulator 120 is originally determined by the bandwidth of the ET modulator itself, the bandwidth of the ET modulator 120 is limited to be lower than the original bandwidth by the frequency limiting unit 130 coupled to the ET modulator 120, thereby having a specific group delay characteristic. Therefore, since the group delay characteristic of the ET modulator 120 is specified by the frequency limiting unit 130, rather than the original bandwidth of the ET modulator 120, even if the bandwidth of the ET modulator 120 changes according to environmental changes, a circuit configured by combining the ET modulator 120 and the frequency limiting unit 130 may have a group delay characteristic specified by the frequency limiting unit 130.

Accordingly, the group delay having a negative value of the negative group delay unit 110 specified by the frequency determining unit 111 and the group delay having a positive value of the ET modulator 120 specified by the frequency limiting unit 130 are compensated by each other, and the envelope signal passed through the negative group delay unit 110 and the ET modulator 120 is applied to the power supply unit of the power amplifier 20 with a minimized time delay.

Also, in the time delay adjustment apparatus according to the present embodiment, a negative feedback loop, which is negative feedback from the output signal of the ET modulator 120 to the input of the negative group delay unit 110, is not present. Therefore, the time delay adjustment apparatus according to the present embodiment may exhibit a faster response performance than the apparatus according to the prior art.

The operation of an exemplary embodiment according to the present disclosure will be described in further detail with reference to FIG. 6.

Figure 6:
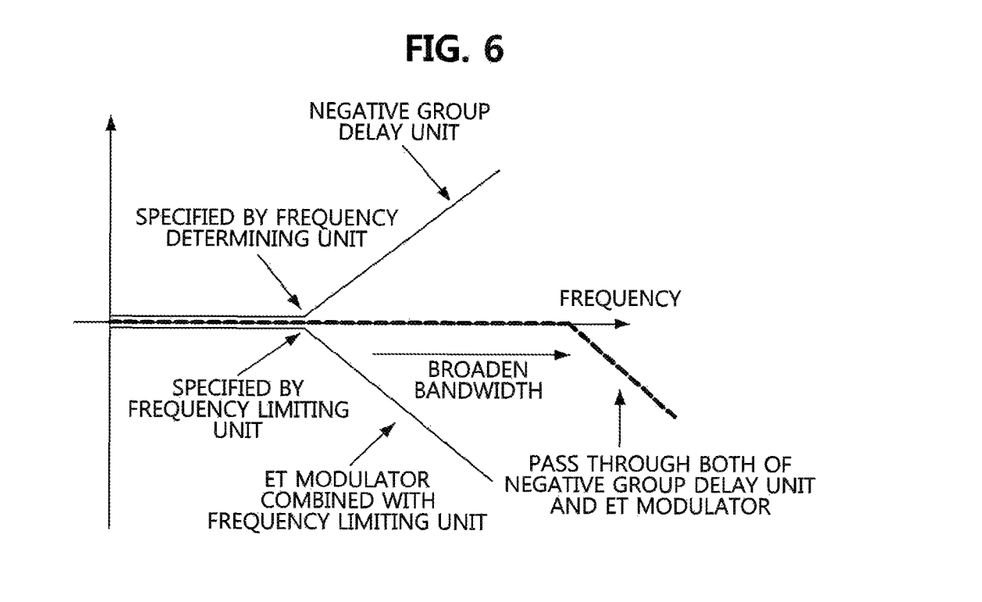
FIG. 6 is a diagram explaining frequency-dependent aspects of an envelope signal time delay adjustment apparatus according to an exemplary embodiment of the present disclosure.

FIG. 6 is a diagram explaining frequency-dependent aspects of an envelope signal time delay adjustment apparatus according to an exemplary embodiment of the present disclosure.

Referring to FIG. 6, the frequency characteristic of the negative group delay unit 110 may be specified by the frequency determining unit 111, and thereby the group delay characteristic may be specified. Also, the frequency characteristic of the ET modulator 120 combined with the frequency limiting unit 130 may be specified by the frequency limiting unit 130.

If the frequency at which the magnitude starts to increase by the frequency determining unit 111 and the frequency at which the bandwidth of the ET modulator 120 starts to be restricted by the frequency limiting unit 130 are located in a similar frequency band, the frequency characteristic experienced by the envelope signal passing through both the negative group delay unit 110 and the ET modulator 120 may be illustrated with a dotted line in FIG. 6.

Therefore, this dotted line has the same effect as broadening the bandwidth of the ET modulator 120 as compared with the case where there is no negative group delay unit 110, so that the time delay is reduced.

Figure 7:
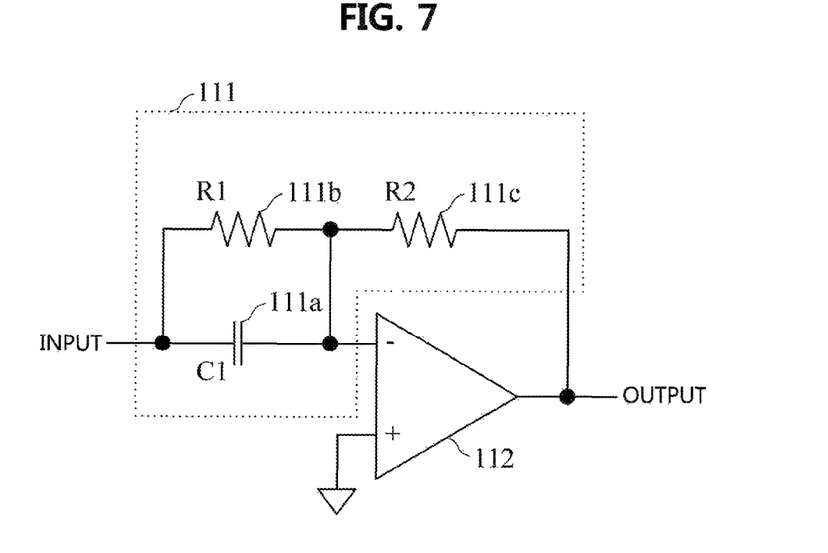
FIG. 7 is an example of a circuit for a negative group delay unit according to an exemplary embodiment of the present disclosure.

FIG. 7 is an example of a circuit for a negative group delay unit according to an exemplary embodiment of the present disclosure.

Referring to FIG. 7, the negative group delay unit 110 may comprise the frequency determining unit 111 which is an RC circuit, and the group delay auxiliary unit 112 which is an amplifier.

The frequency determining unit 111 may include a first capacitor 111a and a first resistor 111b connected in parallel between an input terminal connected to the signal generator 10 and a negative input terminal of the negative group delay auxiliary unit 1120, and a second resistor 111c connected between the negative input terminal and the output terminal of the negative group delay auxiliary unit 112.

In the circuit of the negative group delay unit 110 shown in FIG. 7, a transfer function from the input to the output may be expressed by a below equation 4.

$$\frac{Output}{Input} = -\frac{R_2}{R_1}(1 + j2\pi f R_1 C_1) \qquad \text{[Equation 4]}$$

Referring to the equation 4, the negative group delay unit 110 may have a frequency characteristic in which its gain is constant as $$\left(-\frac{R_2}{R_1}\right),$$

and then gradually increases from the frequency $$\frac{1}{2\pi f R_1 C_1}.$$

This is the same as the frequency response characteristic of the negative group delay unit 110 shown in FIG. 6.

That is, the frequency characteristic of the negative group delay unit 110 may be determined by the frequency determining unit 111, and the frequency determining unit 111 combined with the amplifier which is the negative group delay auxiliary unit 112 may act as the negative group delay unit 110 in FIG. 5.

Here, although the circuit shown in FIG. 7 is illustrated as having a single-ended input, but the circuit may also be configured to have a differential input. In addition, although the circuit shown in FIG. 7 is illustrated as having a single-ended output, but the circuit may also be configured to have a differential output.

Figure 8:
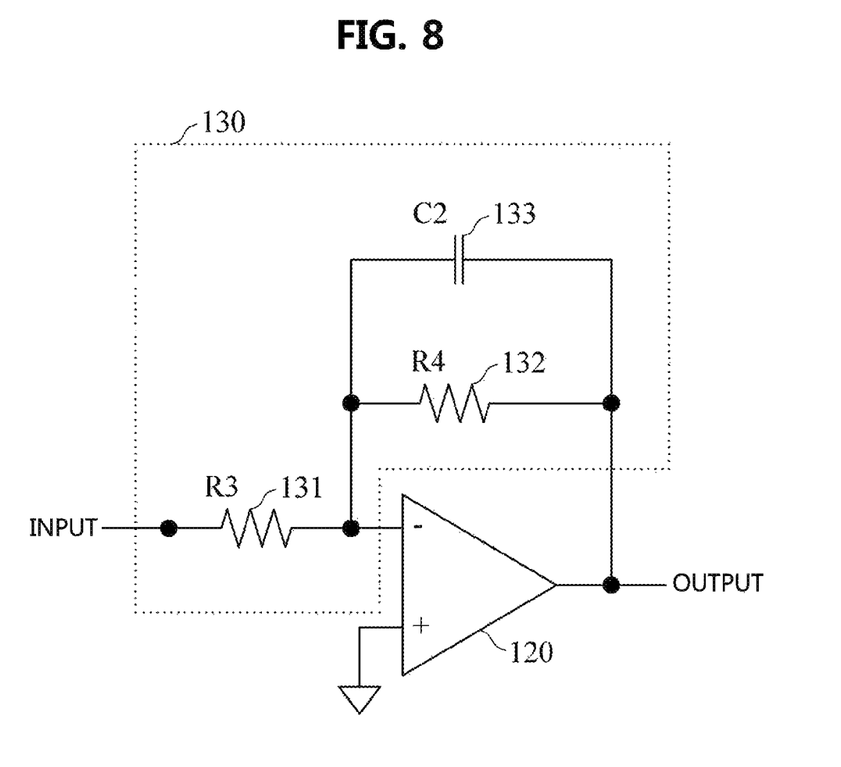
FIG. 8 is a diagram illustrating an example of a frequency limiting circuit combined with an envelope-tracking modulator according to the present disclosure.

FIG. 8 is a diagram illustrating an example of a frequency limiting circuit combined with an envelope-tracking modulator according to the present disclosure.

Referring to FIG. 8, the frequency limiting unit 130 may be combined with the ET modulator 120, and constantly limit the bandwidth of the ET modulator 120 to keep the group delay constant. In detail, the frequency limiting unit 130 may include a third resistor 131 connected between an input terminal connected to the negative group delay unit 110 and a negative input terminal of the ET modulator 120, a second capacitor 133 and a fourth resistor 132 connected in parallel between the negative input terminal and the output terminal of the ET modulator 120.

In the circuit illustrated in FIG. 8 which includes the ET modulator 120 and the frequency limiting unit 130, a transfer function from the input to the output may be expressed by a below equation 5.

$$\frac{\text{Output}}{\text{Input}} = -\frac{R_2}{R_1}\left(\frac{1}{1 + j2\pi fR_2C_1}\right) \quad [\text{Equation 5}]$$

Referring to the equation 5, the envelope-tracking modulator 120 combined with the frequency limiting unit 130 illustrated in FIG. 8 may have frequency characteristics that its gain is constant as $$\left(-\frac{R_2}{R_1}\right),$$

and then gradually decreases from the frequency $2\pi fR_2 C_1$.

This is the same as the frequency response characteristic of the ET modulator 120 combined with the frequency limiting unit 130 shown in FIG. 6. That is, the frequency characteristic of the ET modulator 120 combined with the frequency limiting unit 130 shown in FIG. 8 may be determined by the frequency limiting unit 130, and the ET modulator 120 may operate as the ET modulator 120 combined with the frequency limiting unit 130 in FIG. 5.

In this case, although the circuit shown in FIG. 8 is illustrated as having a single-ended input, but the circuit may also be configured to have a differential input. In addition, although the circuit shown in FIG. 8 is illustrated as having a single-ended output, but the circuit may also be configured to have a differential output.

Figure 9:
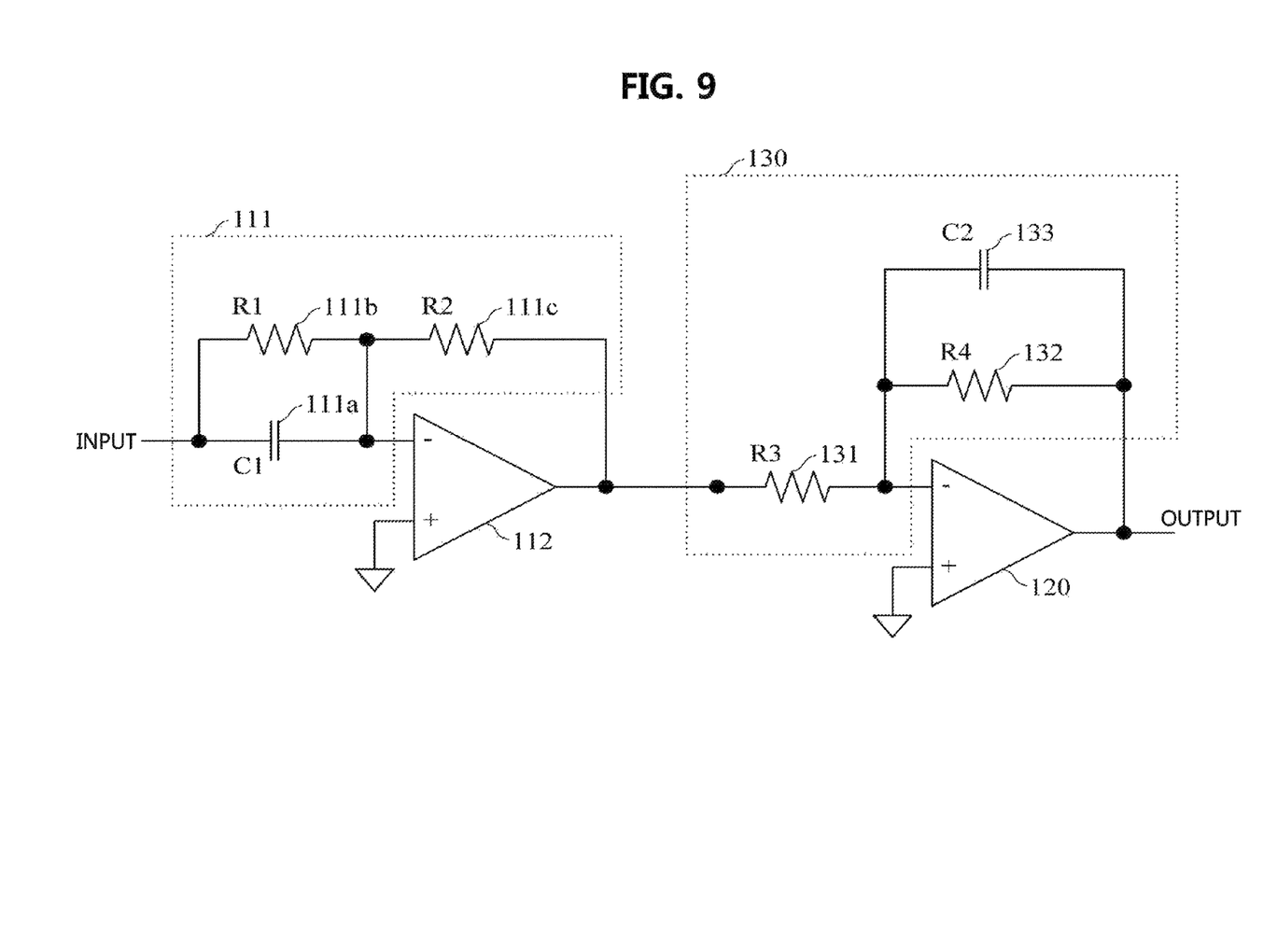
FIG. 9 is a diagram illustrating an example of an overall circuit of an envelope signal time delay adjustment apparatus according to an exemplary embodiment of the present disclosure.

FIG. 9 is a diagram illustrating an example of an overall circuit of an envelope signal time delay adjustment apparatus according to an exemplary embodiment of the present disclosure.

The overall transfer function of the envelope signal time delay adjustment apparatus shown in FIG. 9 may be expressed as a below equation 6.

$$\frac{\text{Output}}{\text{Input}} = -\frac{R_2}{R_1}(1 + j2\pi fR_1C_1) \times \left\{-\frac{R_4}{R_3}\left(\frac{1}{1 + j2\pi fR_4C_2}\right)\right\} \quad [\text{Equation 6}]$$

The equation 6 may be expressed as the product of the equation 4 and the equation 5. In this case, if $R_1$, $C_1$, $R_4$, and $C_2$ are defined so as to satisfy $R_1C_1=R_4C_2$ in the equation 6, the transfer function of FIG. 9 may be simplified into a below equation 7.

$$\frac{\text{Output}}{\text{Input}} = -\frac{R_2}{R_1} \times \left(-\frac{R_4}{R_3}\right) \quad [\text{Equation 7}]$$

That is, it can be understood that the bandwidth of the ET modulator 120 combined with the frequency limiting unit 130 can be made wider than before by the negative group delay unit 110 including the frequency determining unit 111. Therefore, it can be understood that the group delay characteristic is reduced more than before due to the wider bandwidth.

In addition, although the equation 7 shows that a constant gain is provided over the entire frequency, when a real circuit is implemented, it has a characteristic that its gain is attenuated eventually due to high frequency poles generated in the negative group delay auxiliary unit 112 and the envelope-tracking modulator 120.

In this case, although the circuit shown in FIG. 9 is illustrated as having a single-ended input, but the circuit may also be configured to have a differential input. Also, although the circuit shown in FIG. 9 is illustrated as having a single-ended output, but the circuit may also be configured to have a differential output.

In addition, the resistance and capacitance elements used in the frequency determining unit 111 and the frequency limiting unit 130 of the circuit shown in FIG. 9 may be affected by changes in the surrounding environment by using elements manufactured in the same process. Here, the resistance and the capacitance elements used in the frequency determining unit 110 and the frequency limiting unit 130 of the circuit shown in FIG. 9 may be located physically close to each other so as to be equally affected by changes in the surrounding environment.

While the embodiments of the present disclosure and their advantages have been described in detail above, it should be understood that various changes, substitutions and alterations may be made herein without departing from the scope of the disclosure.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An envelope signal time delay adjustment apparatus for adjusting a time delay of an envelope signal input from a signal generator and outputting the adjusted envelope signal to an envelope-tracking power amplifier, the envelope signal time delay adjustment apparatus comprising:

a negative group delay unit for converting the envelope signal input from the signal generator into an envelope signal having a group delay of a negative value, wherein a gain of the negative group delay unit for the envelope signal from the signal generator increases for a predetermined frequency range;

an envelope-tracking modulator for power-amplifying and outputting the envelope signal having the negative group delay, which is output from the negative group delay unit; and a frequency limiting unit for limiting a bandwidth of the envelope-tracking modulator to be lower than an original bandwidth of the envelope-tracking modulator, wherein the negative group delay of the negative group delay unit compensates for a positive group delay of the envelope-tracking modulator to thereby compensate for the time delay of the envelope signal itself and minimize a misalignment between the, envelope signal and a radio frequency (RF) signal which is output from the signal generator to the envelope-tracking power amplifier.

2. The envelope signal time delay adjustment apparatus according to claim 1, wherein the negative group delay unit comprises:

a negative group, delay auxiliary unit for converting the envelope signal input from the signal generator into the envelope signal having the group delay of the negative value and outputting the envelope signal; and a frequency determining unit for determining the predetermined frequency band, wherein a gain of the envelope signal output from the negative group delay auxiliary unit increases as the frequency of the envelope signal increases from the predetermined frequency band.

3. The envelope signal time delay adjustment apparatus according to claim 2, wherein the frequency determining unit comprises a first capacitor and a first resistor connected in parallel between an input terminal connected to the signal generator and a negative input terminal of the negative group delay auxiliary unit; and a second resistor connected between the negative input terminal and the output terminal of the negative group delay auxiliary unit.

4. The envelope signal time delay adjustment apparatus according to claim 2, wherein the frequency limiting unit comprises a third resistor connected between an input terminal connected to the negative group delay unit and a negative input terminal of the envelope-tracking modulator; and a second capacitor and a fourth resistor connected in parallel between the negative input terminal and an output terminal of the envelope-tracking modulator.

* * * * *